(12) United States Patent
Bonilla et al.

(10) Patent No.: US 9,852,980 B2
(45) Date of Patent: Dec. 26, 2017

(54) INTERCONNECT STRUCTURE HAVING SUBSTRACTIVE ETCH FEATURE AND DAMASCENE FEATURE

(71) Applicant: INTERNATIONAL BUSINESS MACHINES CORPORATION, Armonk, NY (US)

(72) Inventors: Griselda Bonilla, Hopewell Junction, NY (US); Samuel S. Choi, Hopewell Junction, NY (US); Ronald G. Filippi, Wappingers Falls, NY (US); Elbert E. Huang, Carmel, NY (US); Naftali E. Lustig, Croton on Hudson, NY (US); Andrew H. Simon, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/405,344

(22) Filed: Jan. 13, 2017

(65) Prior Publication Data
US 2017/0221815 A1    Aug. 3, 2017

Related U.S. Application Data

(60) Continuation of application No. 15/166,570, filed on May 27, 2016, now Pat. No. 9,601,426, which is a
(Continued)

(51) Int. Cl.
*H01L 23/522* (2006.01)
*H01L 23/528* (2006.01)
(Continued)

(52) U.S. Cl.
CPC ...... *H01L 23/5226* (2013.01); *H01L 21/3212* (2013.01); *H01L 21/32133* (2013.01);
(Continued)

(58) Field of Classification Search
CPC .......... H01L 21/32115; H01L 21/3212; H01L 21/3213; H01L 21/32133; H01L 21/32139;
(Continued)

(56) References Cited

U.S. PATENT DOCUMENTS 6,162,583 A * 12/2000 Yang ..................... H01L 21/312
257/E21.244
9,502,350 B1    11/2016 Bonilla et al.
(Continued)

OTHER PUBLICATIONS

U.S. Appl. No. 15/405,344, filed Jan. 13, 2017.
List of IBM Patents or Patent Applictions Treated as Related; (Appendix P), 2 pages.

*Primary Examiner* — Stephen W Smoot
(74) *Attorney, Agent, or Firm* — Cantor Colburn LLP; Steven Meyers

(57) ABSTRACT

Methods of forming an interconnect structure include depositing a first conductive material on a substrate. Aspects include subtractively etching the conductive material to form a patterned first conductive layer, and depositing a dielectric layer on interconnect structure. Aspects also include depositing a second conductive material on the dielectric layer and removing the second conductive material through the top of the second metal liner.

20 Claims, 21 Drawing Sheets

Related U.S. Application Data division of application No. 15/009,108, filed on Jan. 28, 2016, now Pat. No. 9,502,350.

(51) Int. Cl.
*H01L 21/768* (2006.01)
*H01L 21/321* (2006.01)
*H01L 21/3213* (2006.01)
*H01L 21/4763* (2006.01)
*H01L 23/532* (2006.01)

(52) U.S. Cl.
CPC .. *H01L 21/47635* (2013.01); *H01L 21/76802* (2013.01); *H01L 21/76816* (2013.01); *H01L 21/76837* (2013.01); *H01L 21/76838* (2013.01); *H01L 21/76843* (2013.01); *H01L 21/76847* (2013.01); *H01L 21/76852* (2013.01); *H01L 21/76865* (2013.01); *H01L 21/76877* (2013.01); *H01L 21/76883* (2013.01); *H01L 23/5283* (2013.01); *H01L 23/53214* (2013.01); *H01L 23/53228* (2013.01); *H01L 23/53242* (2013.01); *H01L 23/53257* (2013.01); *H01L 23/53295* (2013.01); *H01L 23/53223* (2013.01); *H01L 23/53238* (2013.01); *H01L 23/53252* (2013.01); *H01L 23/53266* (2013.01)

(58) Field of Classification Search
CPC ......... H01L 21/47573; H01L 21/47635; H01L 21/76802; H01L 21/76814; H01L 21/76816; H01L 21/76837; H01L 21/7684; H01L 21/76843; H01L 21/76852; H01L 21/76865; H01L 21/76877; H01L 21/76883; H01L 23/5226; H01L 23/5283; H01L 23/53214; H01L 23/53223; H01L 23/53228; H01L 23/53242; H01L 23/53252; H01L 23/53257; H01L 23/53266

See application file for complete search history.

(56) References Cited

U.S. PATENT DOCUMENTS

| | | | |
|---|---|---|---|
| 9,601,426 B1 | 3/2017 | Bonilla et al. | |
| 2001/0012687 A1* | 8/2001 | Xu | H01L 21/0332 438/631 |
| 2003/0205815 A1* | 11/2003 | Chung | H01L 21/02126 257/758 |
| 2004/0222526 A1* | 11/2004 | Wada | H01L 21/76838 257/753 |
| 2011/0233620 A1* | 9/2011 | Naruse | H01L 23/5226 257/225 |
| 2016/0181200 A1* | 6/2016 | Bao | H01L 21/76898 257/774 |

* cited by examiner

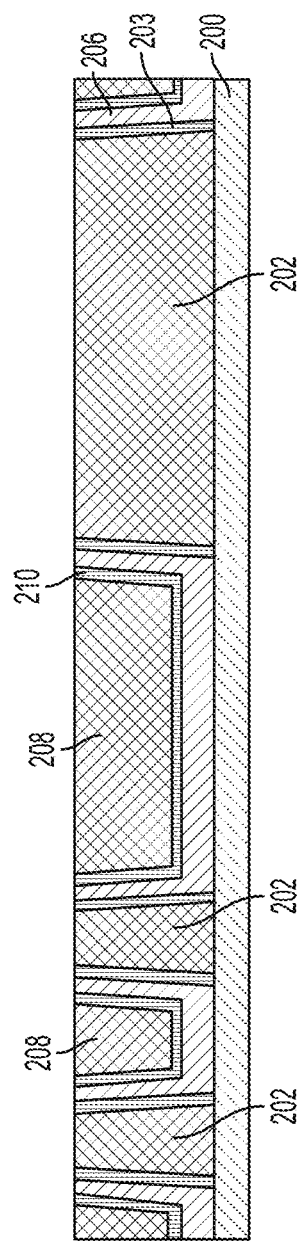

INTERCONNECT STRUCTURE HAVING SUBSTRACTIVE ETCH FEATURE AND DAMASCENE FEATURE

DOMESTIC PRIORITY

This application is a Continuation of U.S. patent application Ser. No. 15/166,570 filed May 27, 2016, entitled "INTERCONNECT SCALING," issued as U.S. Pat. No. 9,601,426, which is a divisional of U.S. patent application Ser. No. 15/009,108 filed Jan. 28, 2016, entitled "INTERCONNECT SCALING," issued as U.S. Pat. No. 9,502,350, the disclosure of which is incorporated by reference herein in its entirety.

BACKGROUND

The present invention relates to methods for fabricating metal wiring layers of a semiconductor device, and more specifically, to methods of fabricating interconnect structures for semiconductor devices with minimized resistance and improved time dependent dielectric breakdown (TDDB) performance.

An integrated circuit (IC) device may be formed with millions of transistors and other circuit elements that are fabricated on a single silicon crystal substrate (wafer). For the IC device to be functional, multi-level or multi-layered interconnection schemes such as, for example, dual damascene wiring (interconnect structures) or wiring formed by subtractive etch, are fabricated using BEOL (back end of line) techniques to connect the circuit elements distributed on the surface of the device. BEOL technologies must be continuously optimized through changes in process flows and material used in order to build high performance structures as critical dimensions decrease. For example, etching of small profiles using thin masking layers becomes increasingly problematic with regard to etch profile control (controlling shape of hole or trench being formed) or control of etching damage and residues. Maximizing metal volume for a given space is difficult with current technologies.

SUMMARY

According to one embodiment, a method of forming an interconnect structure includes depositing a first conductive material on a substrate. The method also includes subtractively etching the conductive material to form a patterned first conductive layer. The method also includes depositing a dielectric layer on the interconnect structure. The method also includes depositing a second conductive material on the dielectric layer. The method also includes removing the second conductive material through the top of the second metal liner.

In another embodiment, a method of forming an interconnect structure includes depositing a first dielectric layer on a first insulator layer. The method also includes patterning a dielectric space pattern in the first dielectric layer. The method also includes patterning a first via having a via vertical wall in the first insulator layer. The method also includes depositing a first conductive material on the structure that fills the first via. The method also includes patterning a first trench pattern in the first conductive material by subtractive etching. The method also includes depositing a second dielectric layer on the structure. The method also includes depositing a second metal liner on the structure. The method also includes depositing a second conductive material on the structure. The method also includes polishing the structure by CMP to form a second level metal structure having a second level vertical wall. In some embodiments, the second metal line is defined by the previous dielectric space and first trench pattern. The method also includes depositing a second insulator layer on the structure.

In yet another embodiment, an interconnect structure includes a first insulator layer. The interconnect structure also includes a first dielectric layer on the first insulator layer. The interconnect structure also includes a subtractive etch feature comprising a first conductive material, the subtractive etch feature having a first subtractive etch vertical wall, a second subtractive etch vertical wall, and an angle between the first vertical wall and a horizontal plane that is less than 90 degrees. The interconnect structure also includes a damascene feature comprising a second conductive material, the damascene feature having a first damascene vertical wall, a second damascene vertical wall, and an angle between the first damascene vertical wall and the horizontal plane that is greater than 90 degrees. In accordance with the embodiment, the first subtractive etch vertical wall is parallel to the second damascene vertical wall.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 5A to 5E illustrate an exemplary fabrication process of forming an interconnect structure according to an exemplary embodiment, in which:

FIG. 5A is a cross-sectional view illustrating an interconnect structure after patterning a conductive material by subtractive etching in accordance with an exemplary embodiment;

FIG. 5B is a cross-sectional view illustrating the interconnect structure after depositing a dielectric layer in accordance with an exemplary embodiment;

FIG. 5C is a cross-sectional view illustrating the interconnect structure after depositing a second metal liner and a second conductive material in accordance with an exemplary embodiment;

FIG. 5D is a cross-sectional view illustrating the structure after polishing to the top of the dielectric layer in accordance with an exemplary embodiment;

FIG. 5E is a cross-sectional view illustrating the structure after polishing to the first conductive material in accordance with an exemplary embodiment.

FIGS. 7A to 7J illustrate an exemplary fabrication process of forming an interconnect structure according to an exemplary embodiment, in which:

FIG. 7A is a cross-sectional view illustrating an interconnect structure after depositing a dielectric layer on an insulator layer in accordance with an exemplary embodiment;

FIG. 7B is a cross-sectional view illustrating an interconnect structure after patterning a dielectric space in the dielectric layer in accordance with an exemplary embodiment;

FIG. 7C is a cross-sectional view illustrating an interconnect structure after patterning a via in the dielectric layer and insulator layer in accordance with an exemplary embodiment;

FIG. 7D is a cross-sectional view illustrating an interconnect structure after depositing a metal liner and conductive material on the structure in accordance with an exemplary embodiment;

FIG. 7E is a cross-sectional view illustrating an interconnect structure after conductive material is patterned to form metal structures and a via in accordance with an exemplary embodiment;

FIG. 7F is a cross-sectional view illustrating an interconnect structure after depositing a second dielectric layer in accordance with an exemplary embodiment;

FIG. 7G is a cross-sectional view illustrating an interconnect structure after patterning a second via pattern in accordance with an exemplary embodiment;

FIG. 7H is a cross-sectional view illustrating an interconnect structure after depositing metal liner and conductive material in accordance with an exemplary embodiment;

FIG. 7I is a cross-sectional view illustrating an interconnect structure after polishing to the top of the second dielectric layer in accordance with an exemplary embodiment;

FIG. 7J is a cross-sectional view illustrating an interconnect structure after depositing a second insulator layer in accordance with an exemplary embodiment.

DETAILED DESCRIPTION

The invention relates to issues pertaining to interconnect scaling in BEOL techniques. It is desirable to increase the efficiency of metal placement in wiring. Interconnect structures in BEOL technologies can be formed by damascene processes and etching. In some cases an opening in the interconnect level may be a via, extending perpendicular to the surface of IC completely through the interlayer dielectric (ILD) for connecting an overlying wire of a higher wiring level or of the present wiring level to an underlying wire of a lower wiring level. A filled via is typically simply referred to as a via or as a plug when connecting to an underlying first metallization (M1) or to an element of an underlying MOS (metal oxide semiconductor) structure.

It is desirable to maximize the metal volume of metal wires for a given space between metal features. Conventional techniques, such as conventional damascene processes and subtractive etch processes, have resulted in inefficient use of volume in interconnect structures because of the sidewall taper angle that results from such processing. A conventional "damascene process," forms conductors in-laid in the dielectric layer. In the context of integrated circuits, damascene means formation of a patterned layer imbedded on and in another layer such that the top surfaces of the two layers are coplanar.

In an exemplary dual damascene process, a dielectric cap and insulator layer are deposited atop a preceding level having metal wiring. The insulator layer may have a dielectric constant k<3.0, such as SiCOH, SiON, TEOS, or silicon oxynitride. Photolithography can be used to define a via and trench pattern to be transferred into the insulator layer and dielectric cap film. Reactive ion etch (RIE) can be used to transfer the photolithography pattern to the dielectric films. Trench and via formation can involve multiple photolithography steps. Hydrofluoric acid can be used to clean the device and a metallization process can be used to deposit a barrier metal, such as tantalum nitride (TaN/Ta), cobalt (Co) and ruthenium (Ru), and seed layer, such as copper (Cu), copper manganese (CuMn), copper aluminum (CuAl), and alloys thereof. Copper reflow or electroless plating with an over burden can be used to fill and planarize the interconnect structure. An anneal can be performed to crystallize the metal. The structure can be polished by chemical mechanical polish to remove the metal overburden and repeated as desired.

Figure 1A:
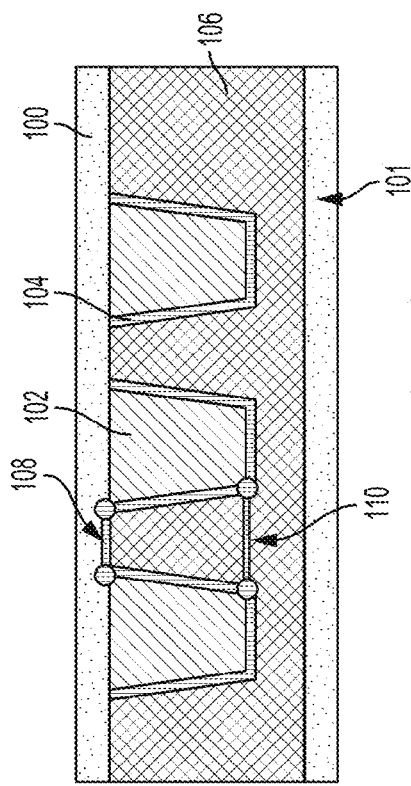
FIG. 1A depicts a cross sectional side view of an exemplary device with idealized interconnect structures defining metal wiring.
Figure 1B:
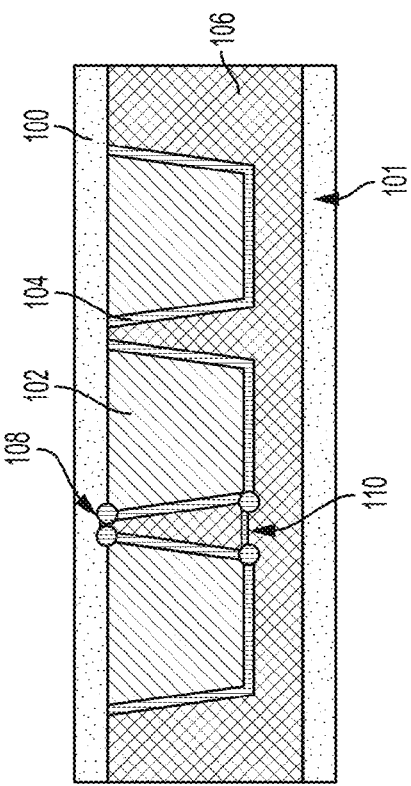
FIG. 1B depicts a cross sectional side view of another exemplary device with idealized interconnect structures defining metal wiring.

FIGS. 1A-1D illustrate the limitations in conventional damascene processes. FIGS. 1A and 1B illustrate idealized metallization in exemplary interconnect structures. As is shown in FIGS. 1A and 1B, a conductive material 102, such as copper or another metal, can be formed in a dielectric layer 106 containing a low-k dielectric material by filling in a trench that is patterned in the dielectric layer 106. A low k dielectric material is a dielectric material with a dielectric constant (k) less than 4. The dielectric layer 106 can be deposited on top of an insulator layer 101 and be capped by a capping layer 100. The conductive material 102 can be separated from the dielectric layer 106 by a metal liner 104. In an ideal structure, the conductive material 102 and metal liner 104 in the trenches are shaped with 90 degree angles, such that they form rectangular or square shapes when viewed in cross section as shown in FIGS. 1A and 1B. The filled trenches are separated from each other by a top separation distance 108 that, in an idealized situation, is predetermined based on patterning and equal to a bottom separation distance 110 of the filled trenches.

In some cases, it is desirable to maximize metal volume to lower metal wire resistances. As shown in FIG. 1B, in an ideal situation the metal volume can be increased by increasing the width of the trenches and filling the trenches with a greater volume of conductive material. In increasing the metal width of the lines as shown in FIG. 1B the top separation distance 108 becomes smaller. It is noted that for FIG. 1A and FIG. 1B, the spacing is uniform from the top to the bottom of the filled trench. This is idealized and not representative of true structures formed by damascene processes because of the tendency to generate tapered profiles. Furthermore, such structures with rectangular shapes are difficult to fill with metal.

Figure 1C:
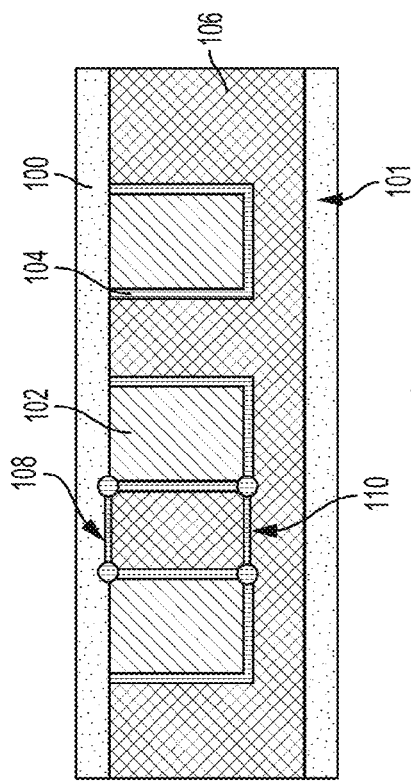
FIG. 1C depicts a cross sectional side view of an exemplary device with interconnect structures defining metal wiring.
Figure 1D:
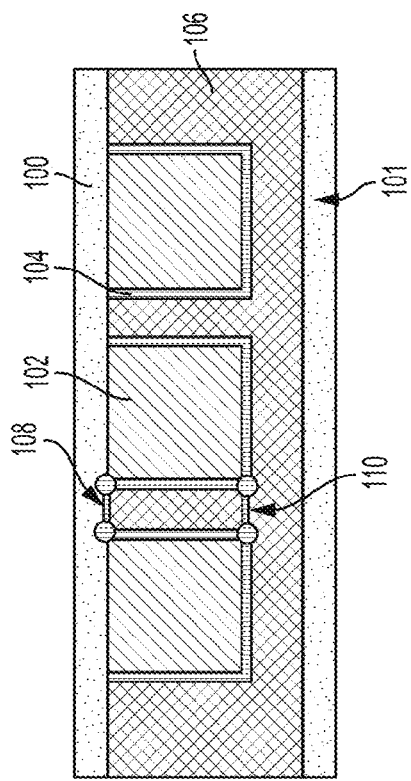
FIG. 1D depicts a cross sectional side view of an exemplary device with interconnect structures defining metal wiring.
Figure 1E:
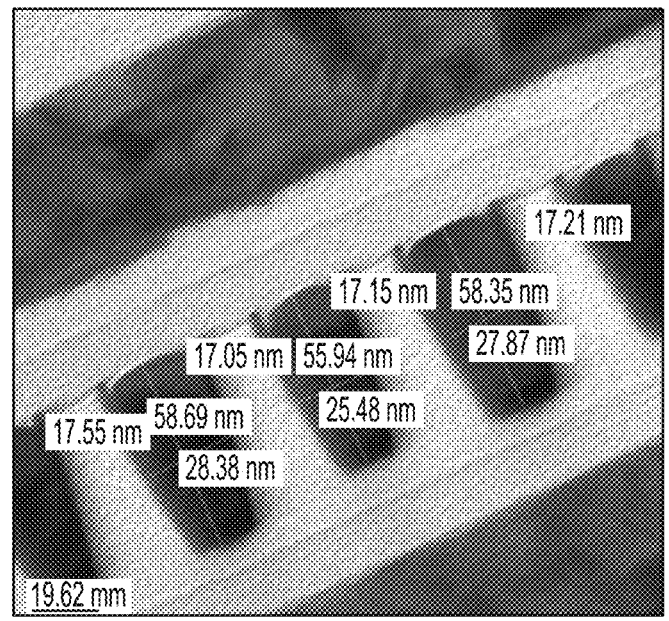
FIG. 1E is a scanning electron micrograph of a damascene structure formed by a conventional damascene process.

FIGS. 1C and 1D illustrate approximate trench shapes that could be expected after a conventional damascene process. As is shown in FIGS. 1C and 1D, the metal liner 104 and conductive material 102 in the trenches does not form 90 degree angles and the top separation distance 108 is not uniform from the top of the trench to the bottom. Thus, if it is desired to increase the volume of conductive material 102 from that illustrated in FIG. 1C to that illustrated in FIG. 1D, top separation distance 108 can become undesirably close and can compromise device performance and reliability. FIG. 1E is a photograph depicting metal structures formed by damascene techniques. It is known that minimum conductor-to-conductor (wire-to-wire or wire-to-via) spacing depends on the taper angle of the conductive material 102 and metal liner 104, illustrated for example in FIGS. 1C-D, in the trenches. For example, it is known that electrical discharge and time dependent dielectric breakdown (TDDB) are strongly dependent upon the separation distance 108 at the top of the trenches.

Accordingly, embodiments of the invention provide BEOL interconnect structures that enhance the efficiency of metal placement in wiring by maximizing the metal volume for a given space between metal features. Moreover, embodiments of the invention can eliminate weak interfaces that would be prone to fail by TDDB and can provide interconnect structures that have enhanced reliability. In some embodiments, the interconnect structures have a uniform or fixed metal spacing from the top of the metal line to the bottom of the line between two adjacent metal features. In some embodiments, the interconnect structures can eliminate critical interfaces between adjacent metal features.

Figure 2:
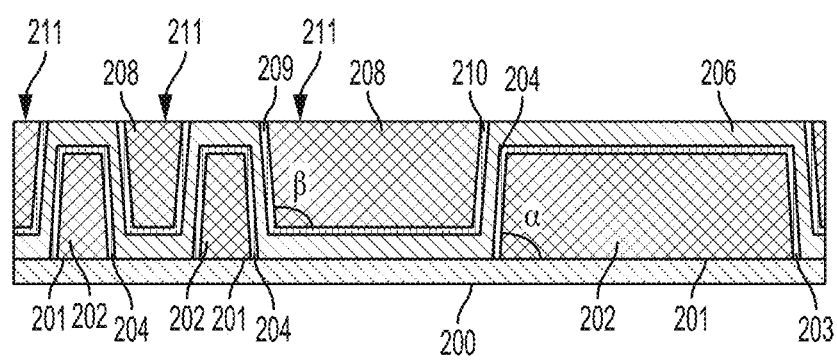
FIG. 2 depicts a cross sectional side view of an exemplary interconnect structure in accordance with an embodiment.

FIG. 2 illustrates an exemplary interconnect structure according to an embodiment. The interconnect structure includes first conductive material 202 patterned on a substrate 200. The first conductive material 202 forms a first conductive wire 201 that has a trapezoidal shape when viewed in cross section with two first layer vertical walls 204 that are tapered. The first conductive material 202 can be patterned by subtractive etching. The taper is such that the angle α between the vertical wall and the substrate is less than 90 degrees. The interconnect structure includes a dielectric layer 206 and preferably a first metal liner 203 and 204. The interconnect structure includes a second conductive material 208 separated from the dielectric layer 206 by a second metal liner 210 and 211. The second conductive material 208 can have the same composition as the first conductive material 202 or can have a different composition. The second metal liner 210, 211 can have the same composition as the first metal liner 203, 204 or can have a different composition. The second conductive material 208 can form a second conductive wire 211 that has a trapezoidal shape when viewed in cross section with two second layer vertical walls 209 that are tapered. The taper is such that the angle β is greater than 90 degrees and the second layer vertical walls 209 run parallel to the first layer vertical walls 204. The second conductive wire 211 can be formed by a damascene process.

Conductive material, including first conductive material 202 and second conductive material 208, is a conductive material that is suitable for conductors, conductive vias, and conductive wire. Conductive material 208 can be a conductive metal, such as tungsten (W), copper (Cu), aluminum (Al), silver (Ag), cobalt (Co), gold (Au), molybdenum (Mo), and alloys thereof. In some embodiments, first conductive material 202 and second conductive material 208 are the same material. In some embodiments, first conductive material 202 and second conductive material 208 are different materials.

The dielectric layers can include any suitable dielectric material used in interconnect structures and can be the same or different. The dielectric layer can be a single layer or, more preferably, is a composite of several layers including adhesion layers or etch stop layers. For example, the dielectric layer 206 can include a silicon dioxide layer and a carbon containing silicon oxide layer; the dielectric layer 206 can include several layers having different carbon contents; the dielectric layer 206 can include a nitrogen containing layer; the dielectric layer 206 can include a porous layer. In some embodiments, the dielectric layer has a dielectric constant less than or equal to four. In a preferred embodiment, the dielectric layer 206 includes $SiO_2$ or carbon doped oxide (SiCOH). Preferably, the dielectric layer 206 is deposited in a conformal fashion.

Deposition is any process that grows, coats, or otherwise transfers a material onto the wafer. Available technologies include, but are not limited to, thermal oxidation, physical vapor deposition (PVD), chemical vapor deposition (CVD), plasma enhanced chemical vapor deposition (PECVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc. In some embodiments, removal includes dry etch, such as reactive ion etching (RIE) or ion beam etch (IBE).

Patterning is the shaping or altering of deposited materials, and generally involves lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 3:
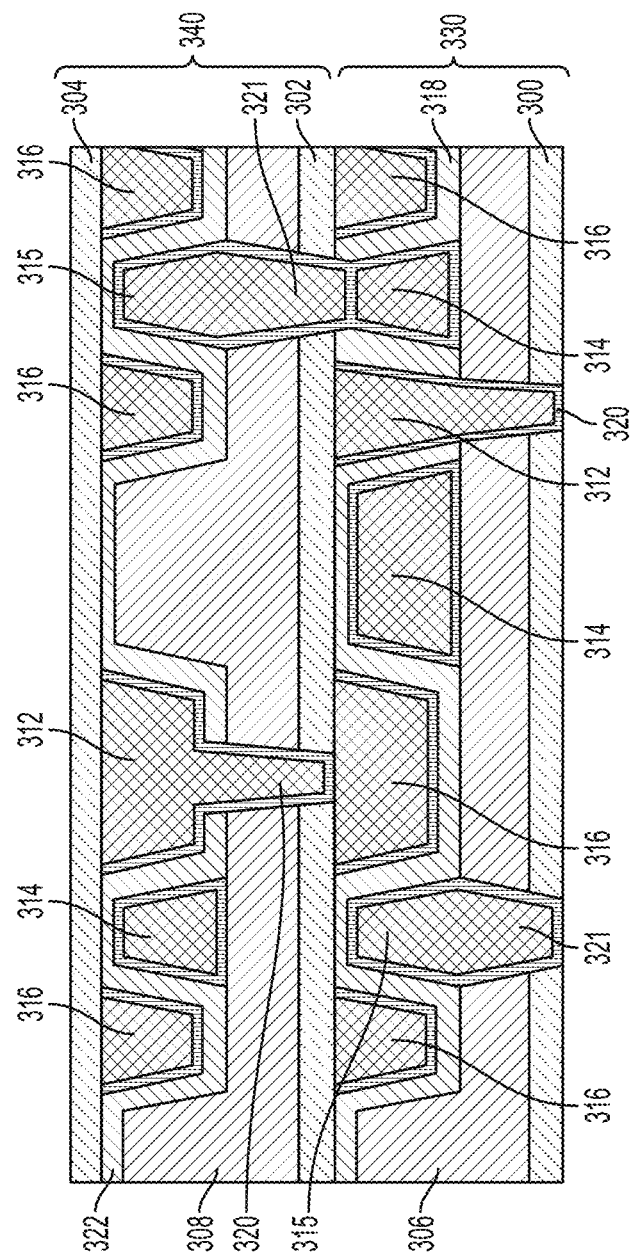
FIG. 3 depicts a cross sectional side view of another exemplary interconnect structure in accordance with an embodiment.

FIG. 3 illustrates another exemplary interconnect structure according to an embodiment. The interconnect structure includes a first layer 330 including a first insulator layer 300 in contact with a first dielectric layer 306. The first dielectric layer 306 can contain a plurality of metal features 312, 314, 315, 316, 320, 321 patterned in the first dielectric layer with subtractive etch processes, damascene processes, or a both subtractive etch and damascene processes. Subtractive etch features forming metal lines 315 and 314 form a trapezoidal shape wherein an angle alpha is formed between a vertical wall and the horizontal plane and alpha is less than 90 degrees. A second dielectric layer 318 can be deposited on top of first dielectric layer 306 and one or more metal features that are formed by subtractive etch processes, 314 and 215, in the first layer 330. Damascene features forming metal lines 312 and 316 form a trapezoidal shapes wherein one or more angles beta are formed between a vertical wall and the horizontal plane and beta is greater than 90 degrees. Some metal features are conductive vias 320, 321 that extend from the one interconnect layer to another interconnect layer (i.e., connecting metal lines from one level to another). As shown in FIG. 3, vias 320, can extend from first dielectric layer through the first insulator layer 300 to a layer beneath the structure, and may underlie metal line features formed damascene processes or features formed by multiple damascene processes 320. Also as shown in FIG. 3, vias 321, can extend from first dielectric layer through the first insulator layer 300 to a layer beneath the structure, and may underlie metal line features formed by subtractive etch processes 315.

The structure can include a second layer 340, which can include a second insulator 302 and a third dielectric layer 308 on top of the second insulator 302. The second layer 340 can include a plurality of metal features, including subtractive etch features 314 and 315, damascene features 312, 316, and conductive vias 320, 321 that extend from the second layer 340 to the first layer 330. A fourth dielectric layer 322 can be deposited on top of the third dielectric layer 308 and one or more metal features of the second layer 340. The device can also include a third insulator 304 covering the second layer 340. The metal features may be lined with a metal liner 320.

Insulator layers 300, 302, 304 can form a dielectric barrier. In a multi-layered device, such as the device shown in FIG. 3, the insulator layers 300, 302, 304 the material used for each layer can be the same or different. Dielectric materials that can be used for the substrate and insulator layers include any now known or later developed dielectric layer such a silicon carbide (SiC), silicon nitride ($Si_3N_4$), silicon dioxide ($SiO_2$), and nitrogen or hydrogen doped silicon carbide (SiC(N,H)).

Any suitable liner material may be used for the metal liners 203, 210, and 320, and the material used for each of the liners 203, 210, and 320 may be the same or different. Typical liner materials include tantalum (Ta), tantalum nitride (TaN), titanium (Ti), titanium nitride (TiN), tungsten (W), ruthenium (Ru) and ruthenium nitride (RuN).

Figure 4:
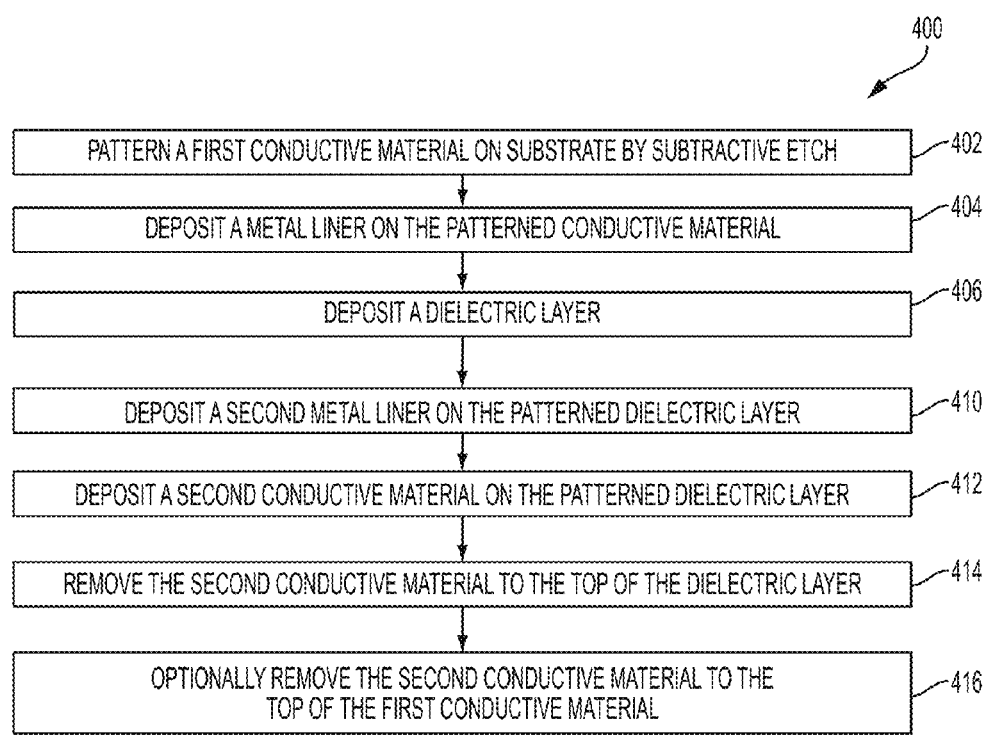
FIG. 4 is a flow diagram of a method of forming an interconnect structure in accordance with an exemplary embodiment.

FIG. 4 is a flowchart of a method 400 of forming an interconnect structure according to one exemplary embodiment. The method 400 includes, as shown at block 402, patterning a first conductive material on a substrate by subtractive etching and depositing a first metal liner on the patterned conductive material. Next, as shown at block 404, the method 400 includes depositing a metal liner on the patterned conductive material and this can be done by utilizing a selective deposition process. The method also includes, as shown at block 406, depositing a dielectric layer. The dielectric layer can be a conformal dielectric layer. The method 400 then includes, as shown at block 410, depositing a second metal liner on the underlying topography. Then, as shown at block 412, the method 400 includes depositing a second conductive material on the patterned dielectric layer. Depositing the second conductive material on the patterned dielectric layer can involve utilizing the topography to form a second conductive material by a damascene process. As shown at block 414, the method then includes removing the second conductive material to the top of the dielectric layer, for example by polishing. In some embodiments, the second conductive material is removed to the top of the dielectric layer by chemical mechanical planarization (CMP). Then, as shown at block 416, in some embodiments, the second conductive material is further removed to the top of the first conductive material.

Figure 5A:
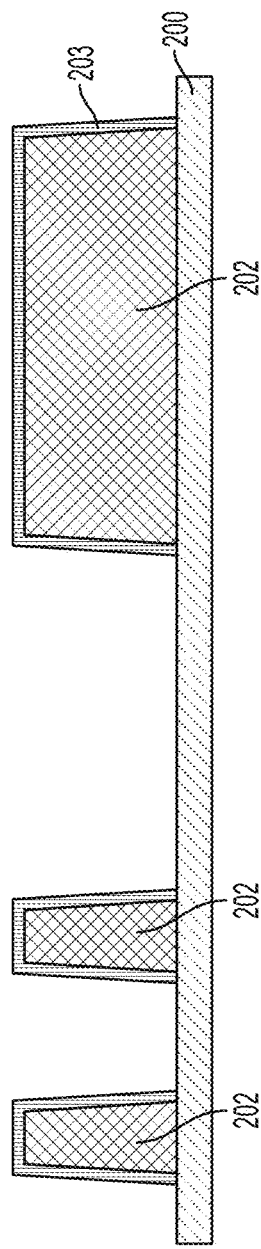
Figure 5B:
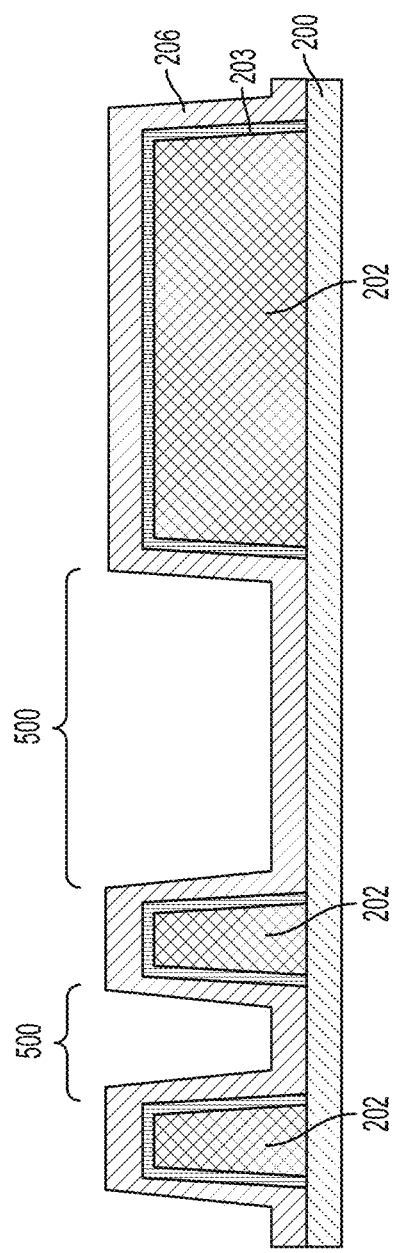
Figure 5C:
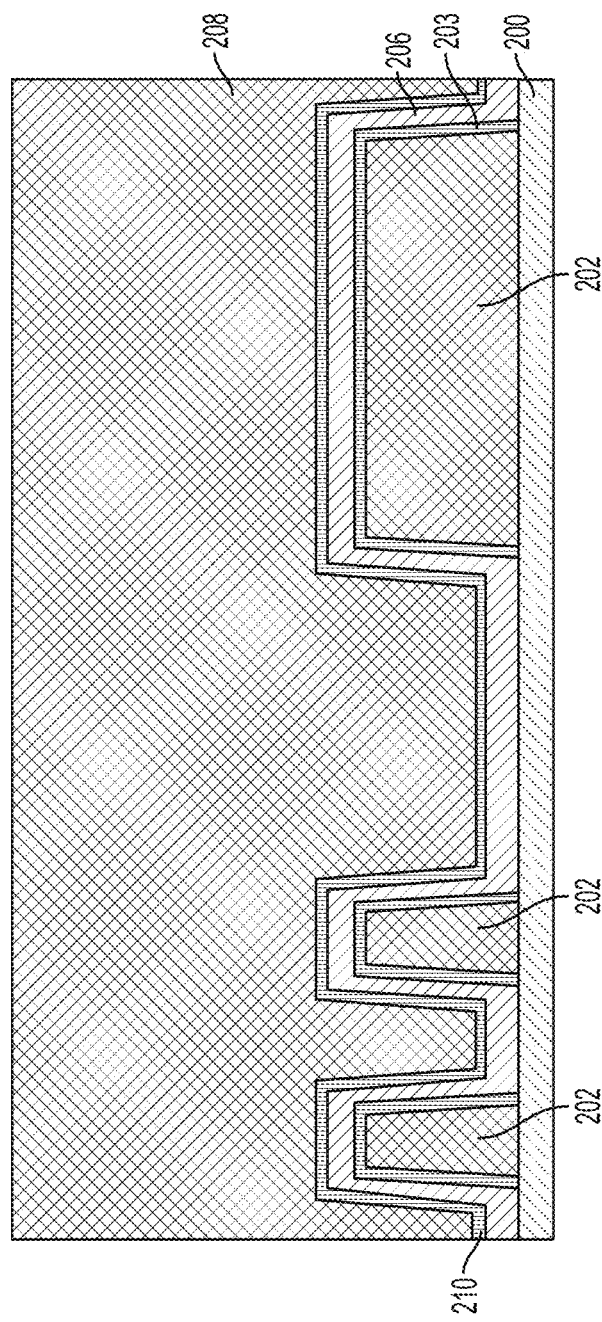
Figure 5D:
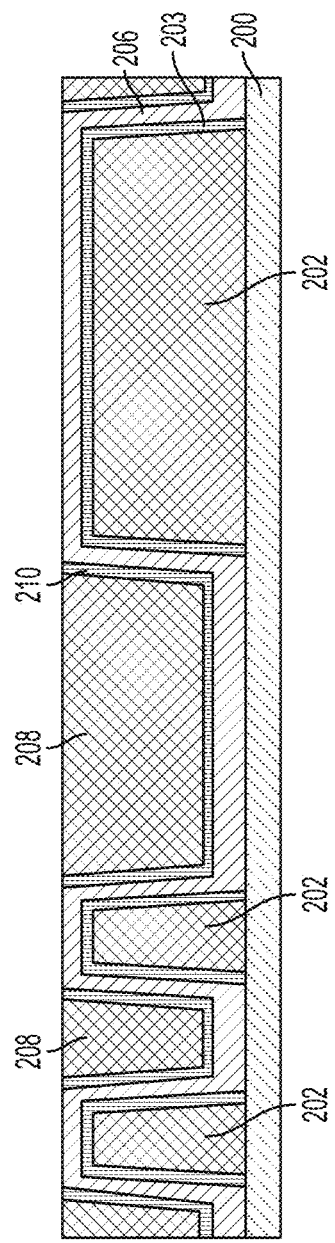

FIGS. 5A-5E illustrate an exemplary method of forming an interconnect structure according to an embodiment. FIG. 5A is a cross-sectional side view illustrating an interconnect structure of an embodiment after patterning a first conductive material 202 on a substrate 200 by subtractive etch and lining the patterned first conductive material with a first metal liner 203. In this example the first metal liner 203 is formed by a selective deposition process such as CVD or electroless plating. FIG. 5B illustrates the structure after depositing a dielectric layer 206 on the structure forming the trenches 500. FIG. 5C illustrates the structure after depositing a second metal liner 210 and a second conductive material 208, also referred to as an overburden, on the patterned dielectric layer. FIG. 5D illustrates the structure after the structure, including the overburden, is polished to the level of the top of the dielectric layer. As illustrated in FIG. 5E, the structure can, in some embodiments, optionally be further polished to the first conductive material.

Figure 6:
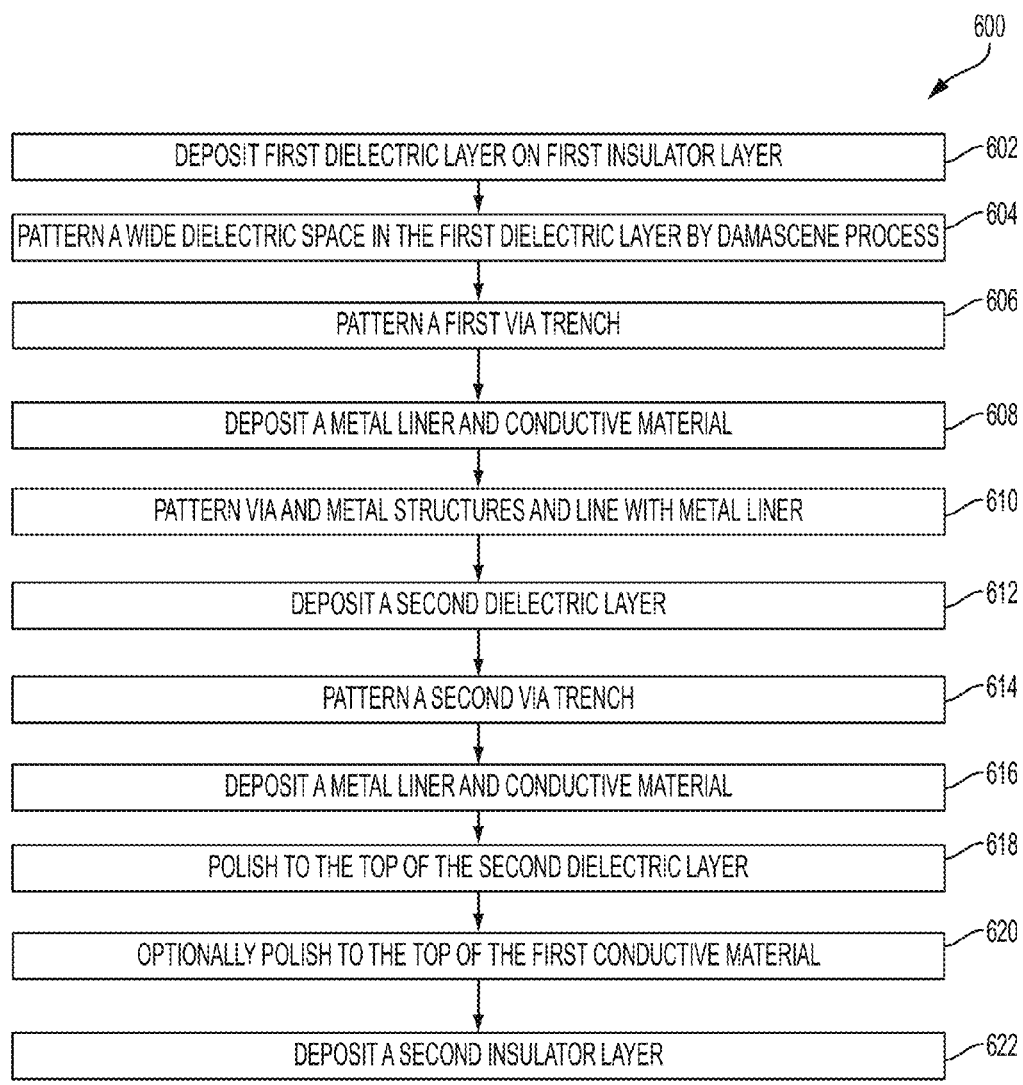
FIG. 6 a flow diagram of a method of forming an interconnect structure in accordance with another exemplary embodiment.

FIG. 6 is a flowchart of another exemplary method 600 of preparing an interconnect structure according to an embodiment. The method 600 includes, as shown at block 602, depositing a first dielectric layer on a first insulator layer. Next, as shown at block 604, the method 600 includes patterning a dielectric space in the first dielectric layer. Then, as shown at block 606, the method 600 includes patterning a first via pattern in the first dielectric layer and the first insulator layer. Then, as shown at block 608, the method 600 includes depositing a metal liner and a conductive material on the structure. Then, as shown at block 610, the conductive material is patterned, for example by subtractive etch, to form metal structures and a first via. The method 600 next includes, as shown at block 612, depositing a second dielectric layer. The method 600 also includes, as shown at block 614, patterning a second via pattern. In some embodiments, the second via pattern can extend through the first dielectric layer, second dielectric layer, and the first insulator layer. Then, as shown at block 616, the method 600 includes depositing a metal liner and conductive material on the structure. Next, as shown at block 618, the structure is polished to a desired height. In some embodiments, the structure is polished to the top of the second dielectric layer. In some embodiments, the structure is polished to the top of the first conductive material, as shown in block 620. Then, as shown at block 622, a second insulator layer is deposited on the device. In some embodiments, the method can be repeated in whole or part to add further layers to the device.

Figure 7A:
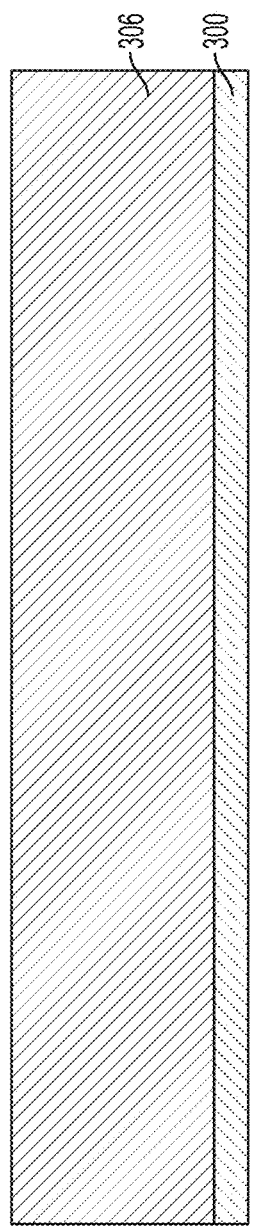
Figure 7B:
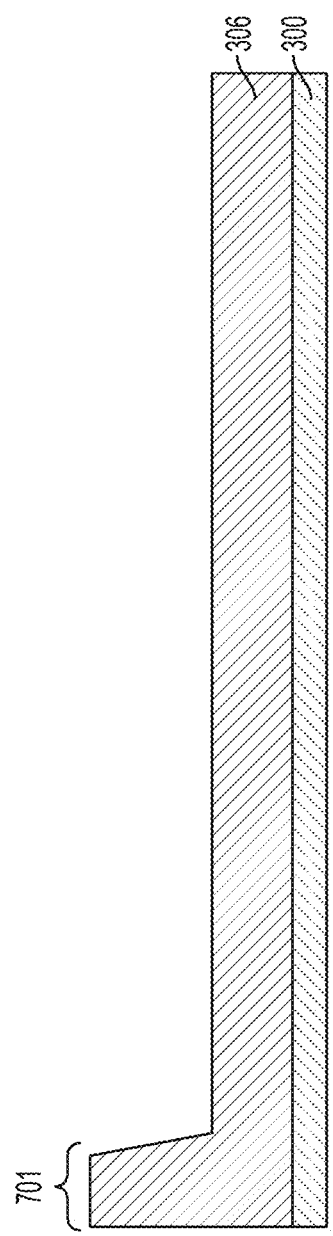
Figure 7C:
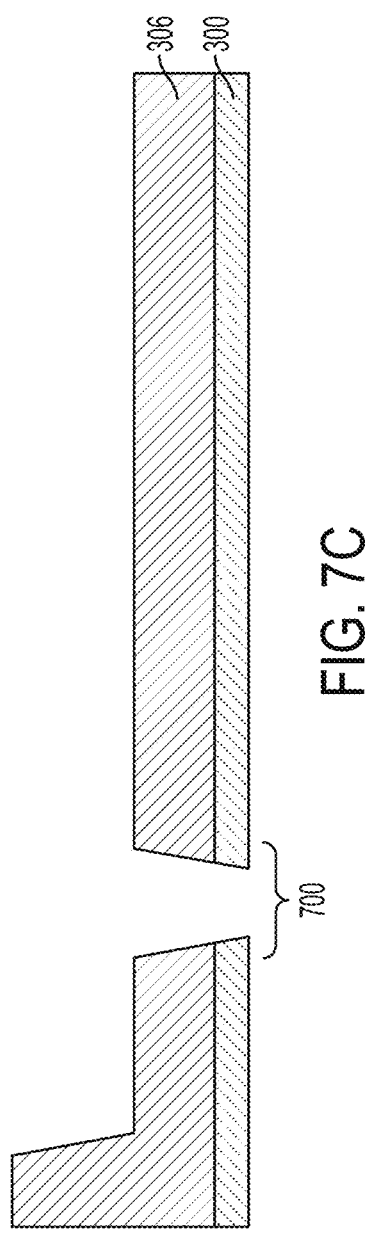

FIGS. 7A-7J illustrate another exemplary method of forming an interconnect structure according to an embodiment. FIG. 7A is a cross-sectional side view illustrating an interconnect structure of an embodiment after depositing a first dielectric layer 306 on a first insulator layer 300. FIG. 7B illustrates the structure after patterning a dielectric space 701 in the first dielectric layer 306. FIG. 7C depicts an interconnect structure after patterning a first via pattern 700 in the first dielectric layer 306 and the first insulator layer 300. For example, the first via pattern 700 can be formed by a damascene process.

Figure 7D:
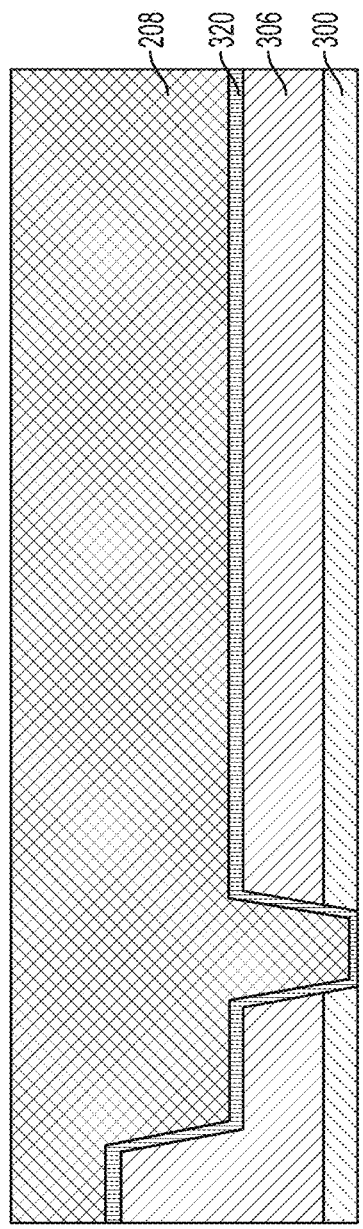
Figure 7E:
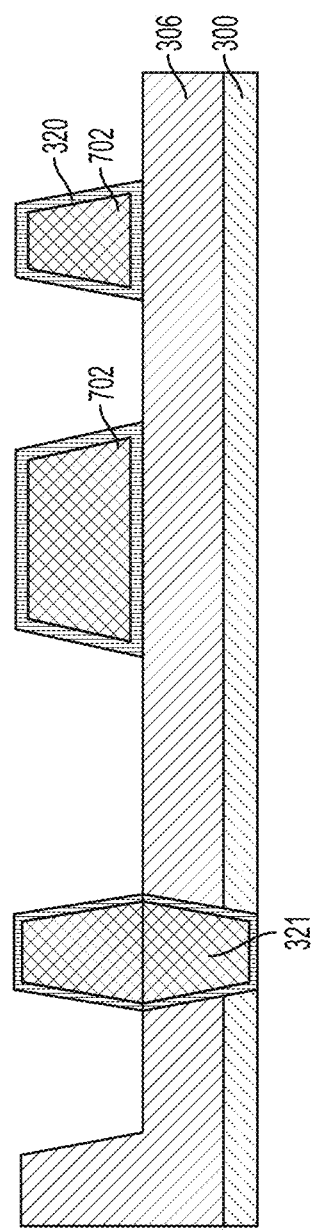
Figure 7F:
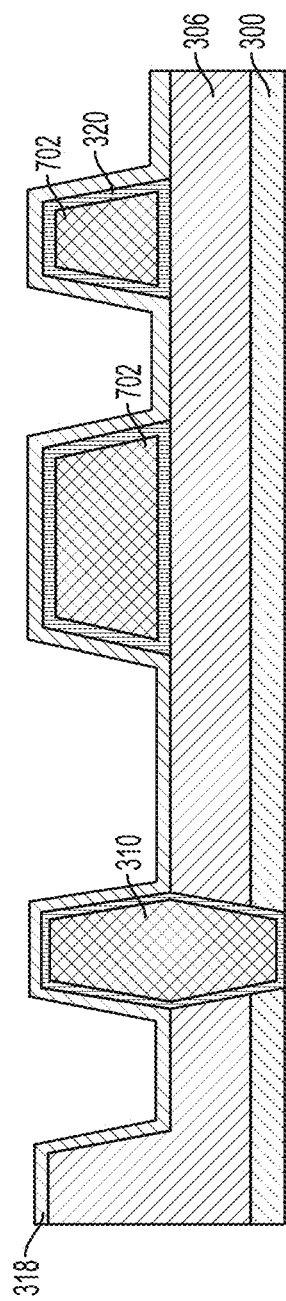
Figure 7G:
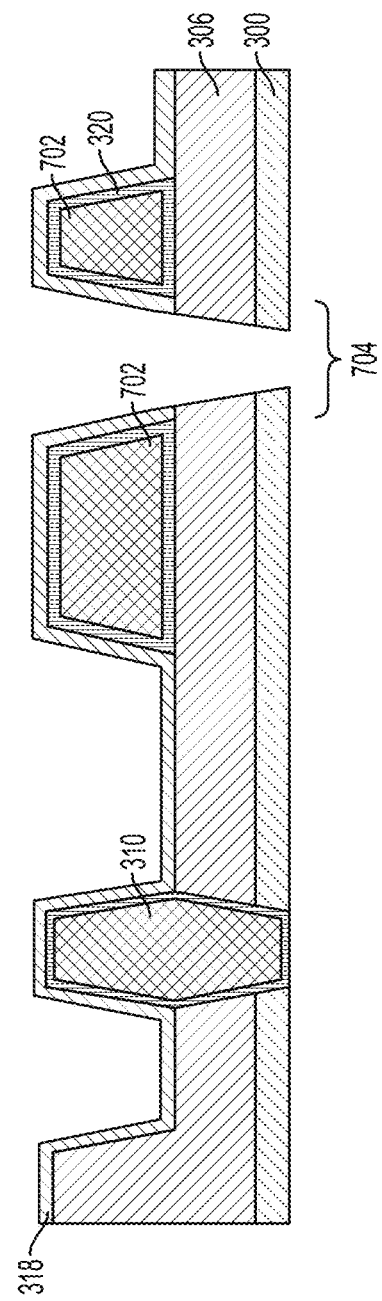
Figure 7H:
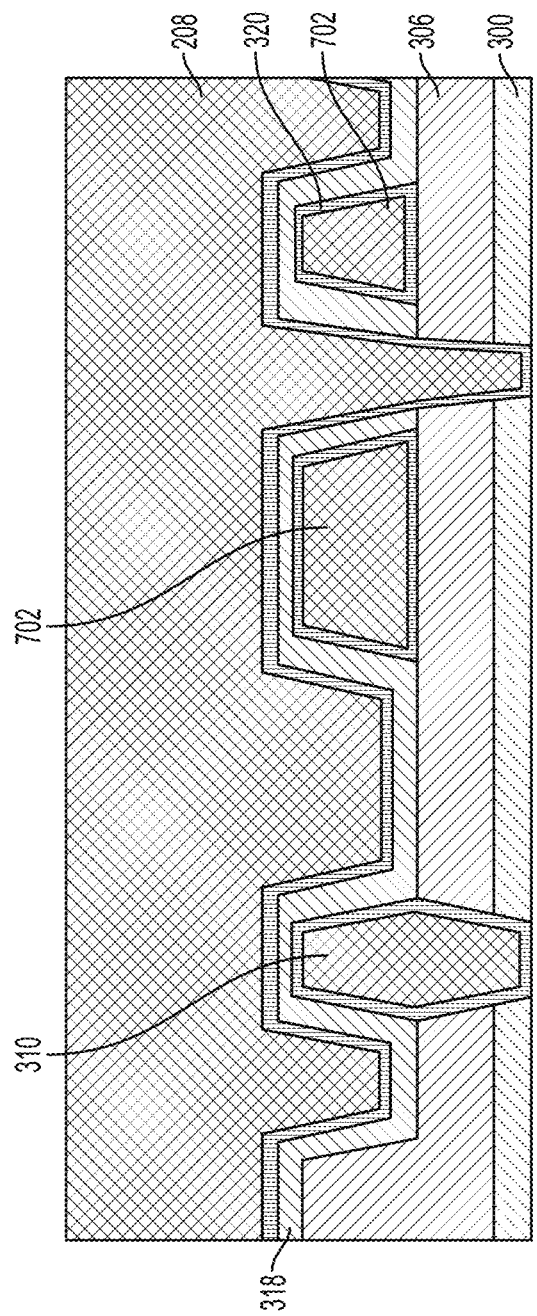
Figure 7I:
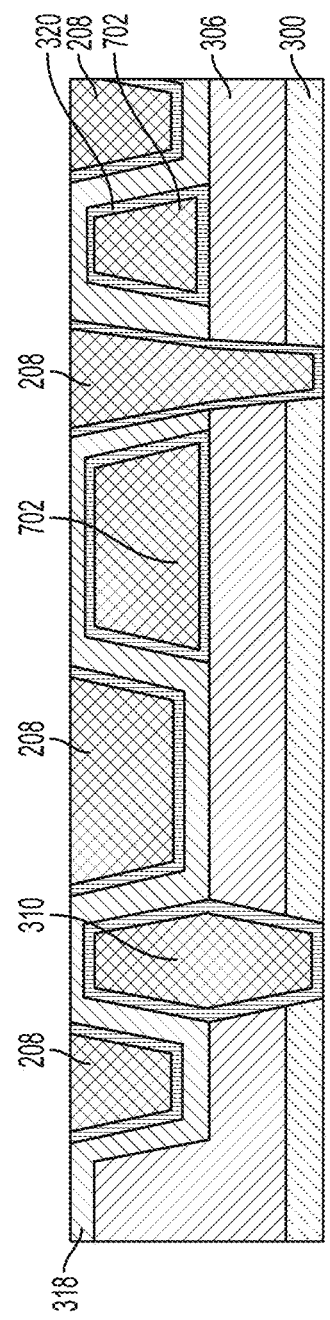
Figure 7J:
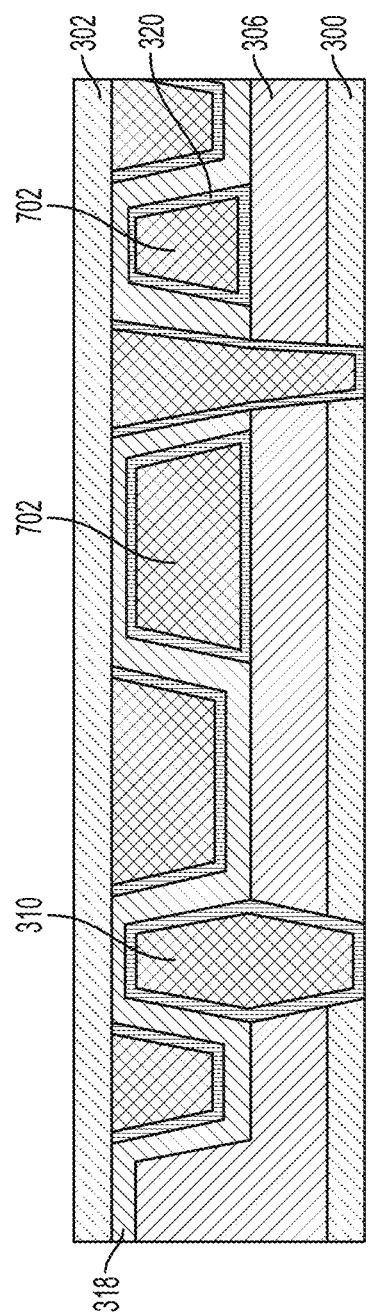

FIG. 7D illustrates the structure after depositing a metal liner 320 and a conductive material 208 on the structure. FIG. 7E illustrates an exemplary structure after the conductive material 208 is patterned, for example by subtractive etch, to form metal structures 702 and a first via 321. A metal liner 320 can be deposited on the metal structures by a selective deposition process, as illustrated. The metal liner 320 can be the same material or a different material than that deposited on the dielectric layer. FIG. 7F illustrates the structure after depositing a second dielectric layer 318 on the metal liner 320, first dielectric layer 306, and metal structures 310, 702. FIG. 7G illustrates the structure after patterning a second via pattern 704. In some embodiments, the second via pattern 704 can extend through the first dielectric layer 306, second dielectric layer 318, and the first insulator layer 300. FIG. 7H illustrates the structure after depositing a metal liner 320 and conductive material 208 on the structure. FIG. 7I illustrates the structure after the structure is polished, for example by CMP, to the top of the second dielectric layer 318. FIG. 7J illustrates the structure after depositing a second insulator layer 302 on the device.

Figure 8:
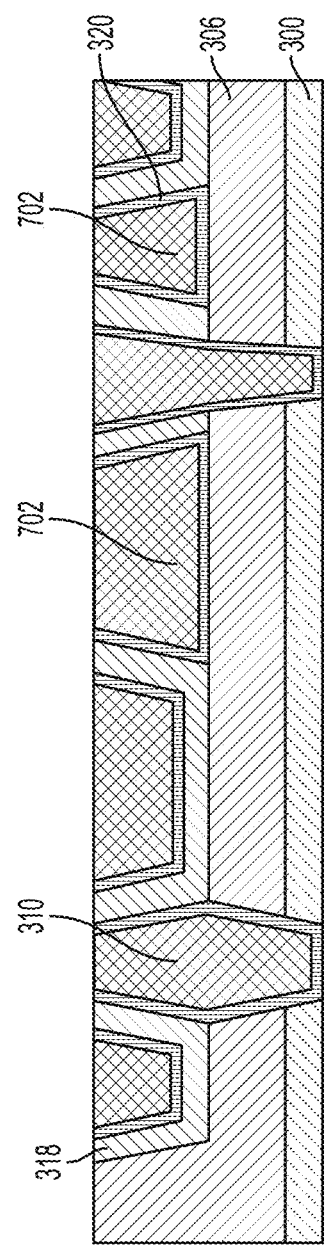
FIG. 8 is a cross-sectional view illustrating the structure of FIG. 7H after polishing to the top of the conductive material in accordance with an exemplary embodiment.

FIG. 8 illustrates an exemplary structure after the structure that is further polished prior to adding a second insulator layer to the top of the first conductive material 320.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An interconnect structure comprising:
   a first layer comprising:
      a first insulator layer;
      a first dielectric layer on the first insulator layer;
      a subtractive etch feature comprising a first conductive material, the subtractive etch feature having a first subtractive etch vertical wall, a second subtractive etch vertical wall, and an angle between the first subtractive etch vertical wall and a horizontal plane that is less than 90 degrees; and
      a damascene feature comprising a second conductive material, the damascene feature having a first damascene vertical wall, a second damascene vertical wall, and an angle between the first damascene vertical wall and the horizontal plane that is greater than 90 degrees;
      wherein the first subtractive etch vertical wall is parallel to the second damascene vertical wall; and
   a second layer comprising:
      a second insulator layer; and
      a metal feature; and
   a conductive via that extends from the second layer to the first layer.

2. The interconnect structure according to claim 1, wherein the metal feature comprises a second subtractive etch feature, the second subtractive etch feature comprising a third conductive material, the second subtractive etch feature having a third subtractive etch vertical wall, a fourth subtractive etch vertical wall, and an angle between the third subtractive etch vertical wall and the horizontal plane that is less than 90 degrees.

3. The interconnect structure according to claim 2, wherein the conductive via that extends from the second layer to the first layer underlies the second subtractive etch feature.

4. The interconnect structure according to claim 1, wherein the metal feature comprises a second damascene feature, the second damascene feature comprising a third damascene vertical wall, a fourth damascene vertical wall, and an angle between the third damascene vertical wall and the horizontal plane that is greater than 90 degrees.

5. The interconnect structure according to claim 1, further comprising a third dielectric layer on top of the second insulator layer.

6. The interconnect structure according to claim 5, further comprising a fourth dielectric layer.

7. The interconnect structure according to claim 1, further comprising a metal liner.

8. The interconnect structure according to claim 7, wherein the metal feature is lined with the metal liner.

9. The interconnect structure according to claim 7, wherein the subtractive etch feature is lined with the metal liner.

10. The interconnect structure according to claim 7, wherein the damascene structure is lined with the metal liner.

11. The interconnect structure according to claim 1, wherein the first dielectric layer has a dielectric constant less than or equal to 4.

12. The interconnect structure according to claim 1, wherein the first dielectric layer comprises silicon dioxide.

13. The interconnect structure according to claim 1, wherein the first dielectric layer comprises carbon doped oxide.

14. The interconnect structure according to claim 1, wherein the first dielectric layer is a composite layer.

15. The interconnect structure according to claim 14, wherein the first dielectric layer comprises an adhesion layer.

16. The interconnect structure according to claim 14, wherein the first dielectric layer comprises an etch stop layer.

17. The interconnect structure according to claim 14, wherein the first dielectric layer comprises nitrogen.

18. The interconnect structure according to claim 14, wherein the first dielectric layer comprises a porous layer.

19. The interconnect structure of claim 1, further comprising a second via.

20. The interconnect structure of claim 19, wherein the second via extends from the first dielectric layer through the first insulator layer to a third layer.

* * * * *